United States Patent
Oshika et al.

(10) Patent No.: US 7,201,956 B2
(45) Date of Patent: Apr. 10, 2007

(54) CUTTING TOOL

(75) Inventors: Takatoshi Oshika, Tsukuba (JP); Toshiaki Ueda, Naka-gun (JP); Takuya Hayahi, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 321 days.

(21) Appl. No.: 10/788,969

(22) Filed: Feb. 26, 2004

(65) Prior Publication Data

US 2004/0224159 A1 Nov. 11, 2004

(30) Foreign Application Priority Data

Feb. 28, 2003 (JP) .............................. 2003-053059
Mar. 4, 2003 (JP) .............................. 2003-056639

(51) Int. Cl.
*B23P 15/28* (2006.01)

(52) U.S. Cl. .................... 428/216; 51/307; 51/309; 428/336; 428/698; 428/701; 428/702

(58) Field of Classification Search .................. 51/307, 51/309; 428/698, 701, 702, 216, 336
See application file for complete search history.

(56) References Cited

U.S. PATENT DOCUMENTS

| | | | |
|---|---|---|---|
| 5,123,934 A | | 6/1992 | Katayama et al. |
| 5,137,774 A | * | 8/1992 | Ruppi ........................ 428/216 |
| 5,543,176 A | * | 8/1996 | Chatfield et al. ........... 428/701 |
| 5,635,247 A | * | 6/1997 | Ruppi ........................ 427/348 |
| 5,654,035 A | | 8/1997 | Ljungberg et al. |
| 5,851,687 A | | 12/1998 | Ljungberg |
| 5,861,210 A | | 1/1999 | Lenander et al. |
| 5,920,760 A | * | 7/1999 | Yoshimura et al. ......... 428/698 |
| 6,183,846 B1 | | 2/2001 | Moriguchi et al. |
| 6,293,739 B1 | | 9/2001 | Uchino et al. |
| 6,333,098 B1 | | 12/2001 | Olsson et al. |

FOREIGN PATENT DOCUMENTS

| | | |
|---|---|---|
| EP | 0 403 461 A1 | 12/1990 |
| EP | 0 408 535 A1 | 1/1991 |
| EP | 0 727 510 B1 | 8/1996 |

(Continued)

OTHER PUBLICATIONS

Patent Abstracts of Japan for JP06-031503 published on Feb. 8, 1994.

(Continued)

*Primary Examiner*—Archene Turner
(74) *Attorney, Agent, or Firm*—Darby & Darby (57) ABSTRACT

The present invention provides a cutting tool in which the hard coating layer demonstrates superior chipping resistance. The cutting tool has a tool base composed with tungsten carbide-based cemented carbide or titanium carbonitride-based Cermet, and a hard coating layer provided on the surface thereof; wherein the hard coating layer includes: (a) a Ti compound and/or Zr compound layer, which is a lower layer, comprising one or more layers of a TiC layer, TiN layer, TiCN layer, TiCO layer, TiCNO layer, ZrC layer, ZrN layer, ZrCN layer, ZrCO layer, ZrCNO layer and (b) an aluminum oxide layer having an α crystal structure which is an upper layer, including the highest peak in the inclination section within a range of 0–10.

3 Claims, 3 Drawing Sheets

FOREIGN PATENT DOCUMENTS

| | | |
|---|---|---|
| EP | 1 288 335 A1 | 3/2003 |
| JP | 06-008010 | 1/1994 |
| JP | 06-031503 | 2/1994 |
| JP | 07-328808 A1 | 12/1995 |
| JP | 11-138308 A1 | 5/1999 |
| JP | 06-8008 A1 | 1/2004 |

OTHER PUBLICATIONS

Patent Abstracts of Japan for JP06-008010 published on Jan. 18, 1994.

European Search Report for EP 04 00 4292 completed Apr. 24, 2006.

* cited by examiner

FIG. 1A

NORMAL TO SURFACE POLISHING PLANE (0001) INCLINATION 0 DEGREES

SURFACE POLISHING PLANE

FIG. 1B

NORMAL TO SURFACE POLISHING PLANE (0001) INCLINATION 45 DEGREES

SURFACE POLISHING PLANE

CUTTING TOOL

BACKGROUND OF THE INVENTION

1. Incorporation by Reference

The present application claims priority under 35 U.S.C. §119 to Japanese Patent Application Nos. 2003-053059 filed on Feb. 28, 2003 and 2003-056639 filed on Mar. 4, 2003. The contents of the applications are incorporated herein by reference in their entirety.

2. Field of the Invention

The present invention relates to a Cermet cutting tool having a coated surface (to be referred to as a coated Cermet cutting tool) used for high-speed, intermittent cutting of various types of steel, cast iron and so forth, and its hard coating layer in particular demonstrates superior chipping resistance.

3. Description of the Related Art

Known examples of coated Cermet cutting tools comprise a base (to be generically referred to as the tool base) made of tungsten carbide (WC)-based cemented carbide or titanium carbide (TiC)-based Cermet, and a hard coating layer. This hard coating layer comprises:

(a) a Ti compound and/or Zr compound layer, which is a lower layer, comprising one or more layers of a Ti carbide (TiC) layer, Ti nitride (TiN) layer, Ti carbonitride (TiCN) layer, Ti oxicarbide (TiCO) layer, Ti oxicarbonitride (TiCNO) layer, Zr carbide (ZrC) layer, Zr nitride (ZrN) layer, Zr carbonitride (ZrCN) layer, Zr oxicarbide (ZrCO) layer and Zr oxicarbonitride (ZrCNO) layer formed by chemical vapor deposition (to be simply referred to as vapor deposition formation), and having an overall mean layer thickness of 0.5–20 μm, and (b) an aluminum oxide layer having an α crystal structure in the vapor deposited state (to be referred to as an $\alpha\text{-}Al_2O_3$ layer), which is an upper layer, and having a mean layer thickness of 1–30 μm.

These coated Cermet cutting tools are widely known to be used for continuous and intermittent cutting of various types of steel, cast iron and so forth.

In addition, Japanese Unexamined Patent Application, First Publication No. Hei 6-31503 discloses that the Ti compound layer and the $\alpha\text{-}Al_2O_3$ layer, which compose a hard coating layer, have a particulate crystal structure.

Moreover, Japanese Unexamined Patent Application, First Publication No. Hei 6-8010 discloses a technology for improving the strength of a TiCN layer comprising the Ti compound layer in which the TiCN layer is made to contain a longitudinally growing crystal structure by vapor deposition with an ordinary chemical vapor deposition device in an intermediate temperature range of 700–950° C. using a mixed gas containing organic carbonitride as the reactive gas.

Cutting devices have recently come to be required to offer higher performance, and there are also strong needs for saving of labor, saving of energy and reduced costs with respect to cutting processing. Accompanying these needs, the speed of cutting processing is tending to become even faster, resulting in the unavoidable circumstances of cutting processing under heavy-duty cutting conditions including greater cutting depth and faster feeding.

There are no problems with the use of the conventional coated Cermet cutting tools in the case of continuous or intermittent cutting of steel or cast iron and so forth under ordinary conditions. However, although the $\alpha\text{-}Al_2O_3$ layer that composes the hard coating layer has superior heat resistance, since it is not provided with adequate strength, when used for high-speed intermittent cutting under severe cutting conditions, namely high-speed intermittent cutting in which thermal shock is repeatedly applied at an extremely short pitch to the cutting edge, chipping occurs easily in the hard coating layer. As a result, the cutting tool reaches the end of its service life in a comparatively short period of time.

SUMMARY OF THE INVENTION

Therefore, the inventors of the present invention conducted research to improve chipping resistance by focusing on a Cermet cutting tool comprising an $\alpha\text{-}Al_2O_3$ layer as the hard coating layer. As a result, the following research results were obtained.

(1) When an $\alpha\text{-}Al_2O_3$ layer, which comprises a hard coating layer, is formed on the surface of a cutting tool by vapor deposition, prior to this formation by vapor deposition, an $Al_2O_3$ core (the $Al_2O_3$ core is preferably an $Al_2O_3$ core thin film having a mean layer thickness of 20–200 nm, to be referred to as an $Al_2O_3$ core thin film) is formed on the surface of the Ti compound and/or Zr compound layer, which is a lower layer, using an ordinary chemical vapor deposition device under low-temperature conditions of a reactive gas composition, in % by volume, of $AlCl_3$: 3–10%, $CO_2$: 0.5–3%, $C_2H_4$: 0.01–0.3% and $H_2$: remainder, reaction atmosphere temperature of 750–900° C., and reaction atmosphere pressure of 3–13 kPa.

Next, an $\alpha\text{-}Al_2O_3$ layer is formed under ordinary conditions on the $Al_2O_3$ core thin film which is heat treated under conditions in which the reaction atmosphere is changed to a hydrogen atmosphere at a pressure of 3–13 kPa and the reaction atmosphere temperature is raised to 1100–1200° C. The $\alpha\text{-}Al_2O_3$ layer obtained in this manner was confirmed to demonstrate a pole plot graph in which the highest peak of the inclination section appears within a narrow range.

Figure 1A:
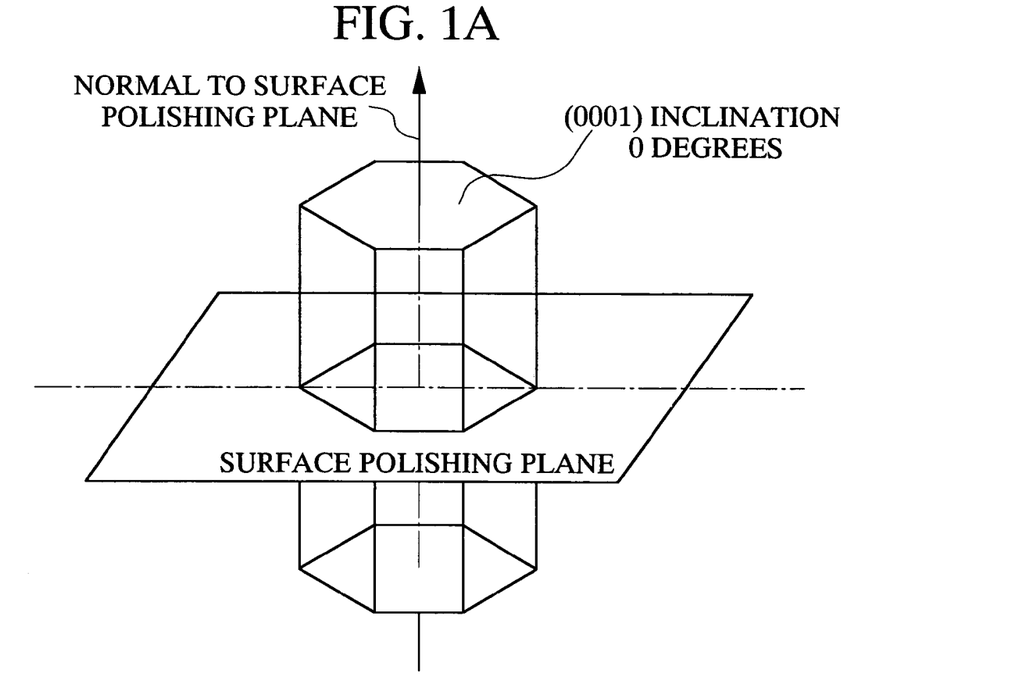
FIGS. 1A and 1B are sketch drawings showing the measuring range of inclination of the (0001) plane of crystal grains in an α-Al$_2$O$_3$ layer which comprises a hard coating layer.
Figure 1B:
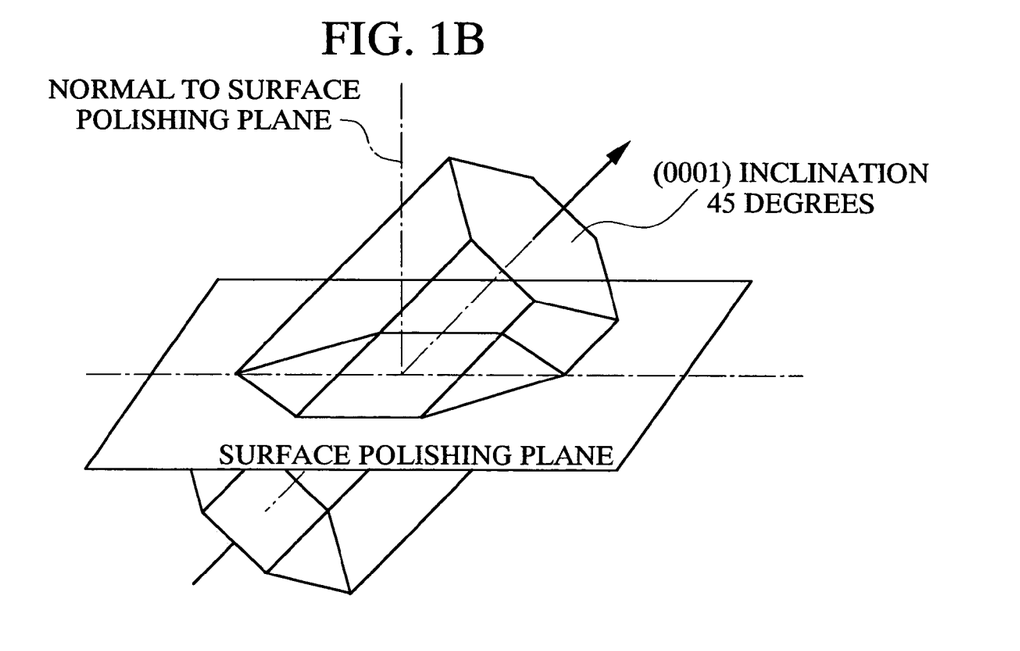
Figure 2:
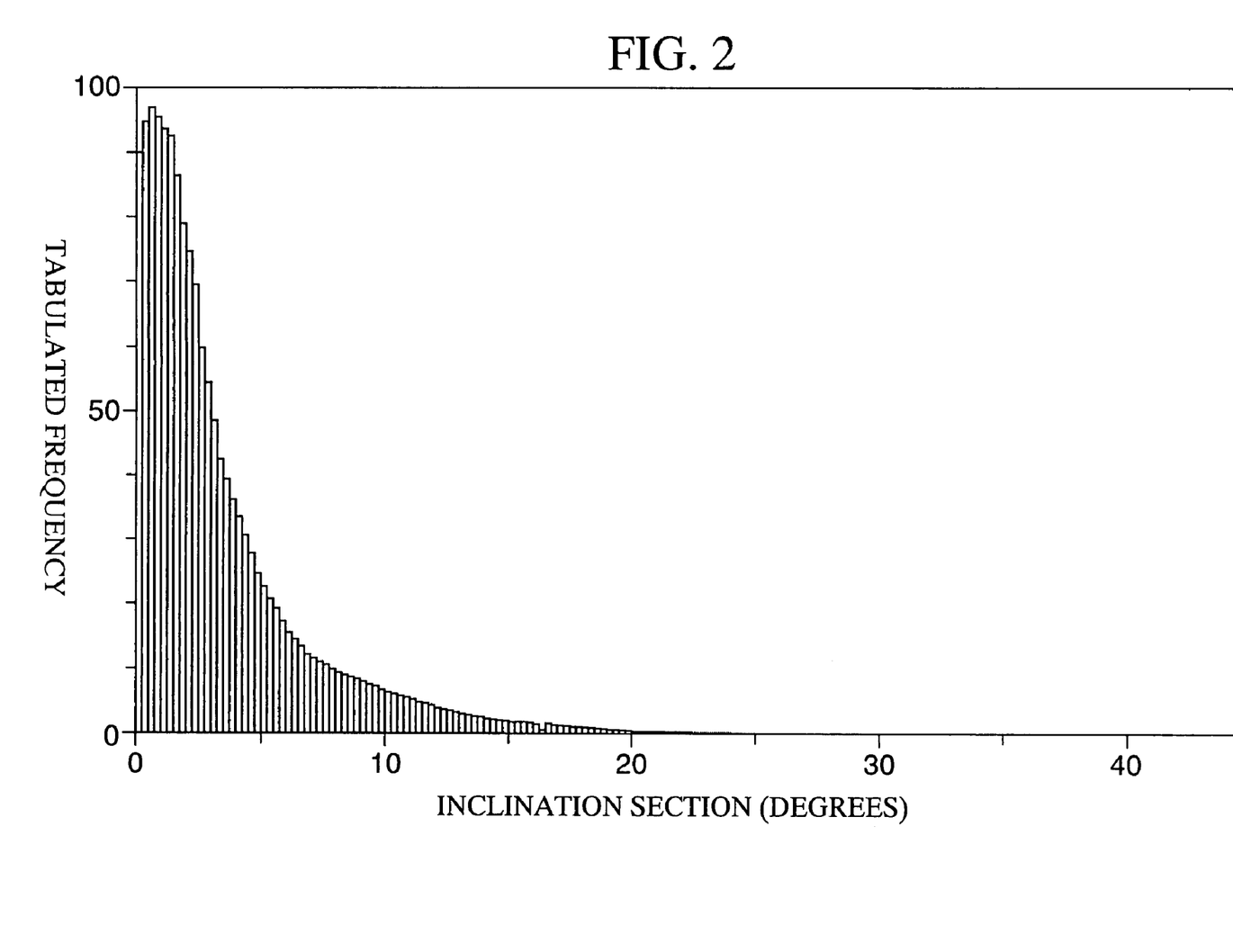
FIG. 2 is a pole plot graph of the (0001) plane of an α-Al$_2$O$_3$ layer which comprises a hard coating layer of the cutting tool of the present invention.

Specifically, as shown in the sketch drawings in FIG. 1, the inclination of the (0001) plane of crystal grains relative to the normal of the surface polishing plane is measured by emitting an electron beam onto individual $\alpha\text{-}Al_2O_3$ crystal grains having a hexagonal crystal lattice present within the measuring range of the surface polishing plane using a field emission scanning electron microscope. Next, the measured inclinations within the range of 0–45 degrees indicated by the individual crystal grains are divided for each pitch of 0.25 degrees, and a pole plot graph is prepared in which the measured inclinations present in each section are tabulated for each section. In this case, as shown in FIG. 2, the pole plot graph is shown in which the highest peak of the inclination division appears within a narrow range of 0–10 degrees.

Figure 3:
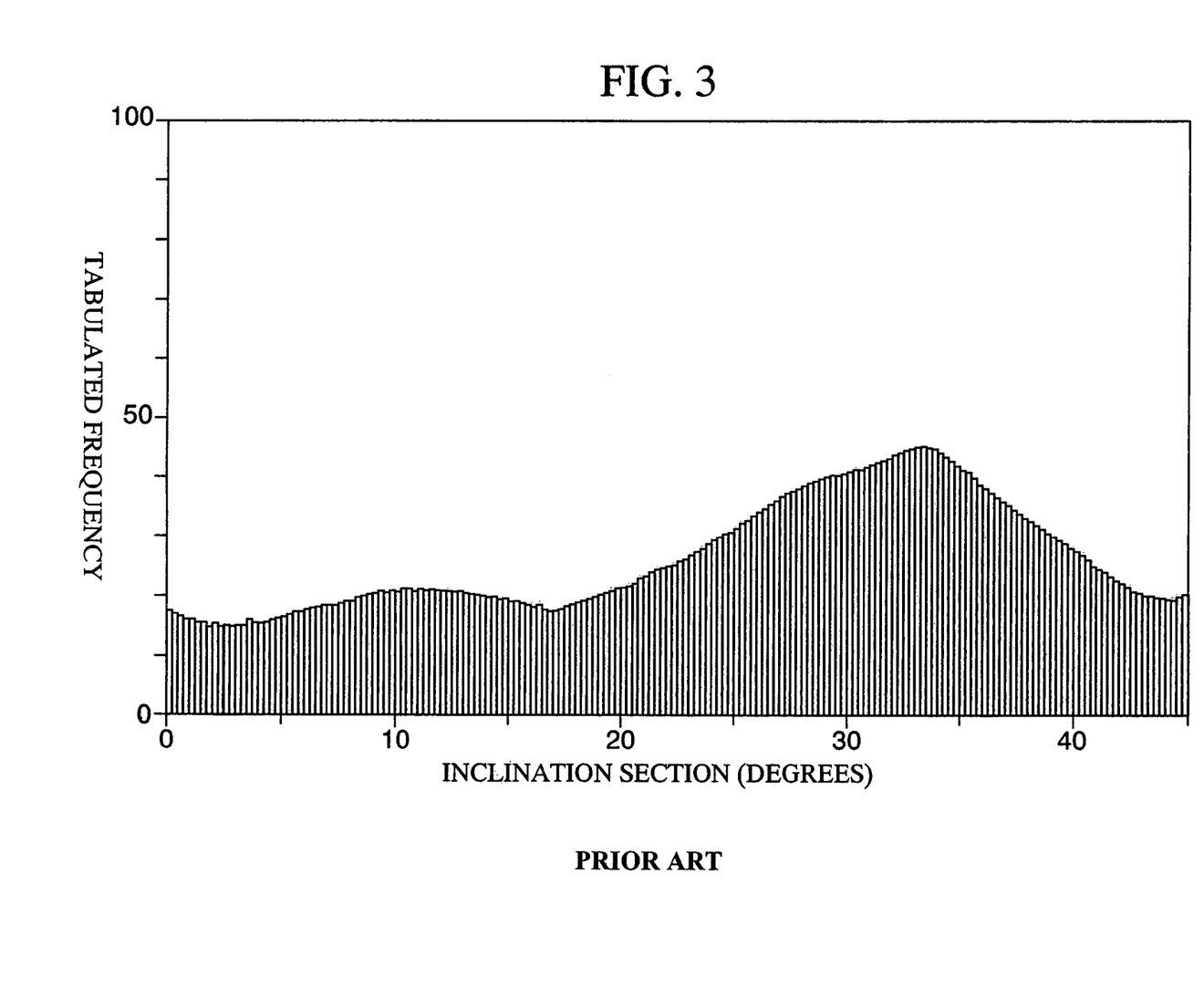
FIG. 3 is a pole plot graph of the (0001) plane of an α-Al$_2$O$_3$ layer which comprises a hard coating layer of a cutting tool of the prior art.

Furthermore, as shown in FIG. 3, a conventional $\alpha\text{-}Al_2O_3$ layer was confirmed to have a pole plot graph in which a gradual highest pitch of the inclination section appears over a wide range of 25–35 degrees.

(2) An $\alpha\text{-}Al_2O_3$ layer formed by vapor deposition on the heat-treated $Al_2O_3$ core thin film has significantly improved strength as compared with a conventional α-Al$_2$O$_3$ layer. Thus, a coated Cermet cutting tool in which a hard coating layer was formed by vapor deposition as the upper layer was confirmed to demonstrate superior chipping resistance as compared with a conventional Cermet cutting tool in which a conventional α-Al$_2$O$_3$ layer was formed by vapor deposition.

The present invention is based on these research results. In order to solve these problems, the present invention provides a cutting tool provided with a tool base composed with WC-based cemented carbide or TiCN-based Cermet, and a hard coating layer; wherein the hard coating layer comprises:

(a) a Ti compound and/or Zr compound layer, which is a lower layer, comprising one or more layers of a TiC layer, TiN layer, TiCN layer, TiCO layer, TiCNO layer, ZrC layer, ZrN layer, ZrCN layer, ZrCO layer and ZrCNO layer, which are formed by vapor deposition, and having an overall mean layer thickness of 0.5–20 µm, and (b) an aluminum oxide layer having an α crystal structure in the state of being formed by vapor deposition (α-Al$_2$O$_3$ layer), which is an upper layer, comprising the highest peak in the inclination section within a range of 0–10 degrees in the case of emitting an electron beam onto individual crystal grains having a hexagonal crystal lattice present within the measuring range of the surface polishing plane, measuring the inclination of the (0001) crystal plane of the crystal grains relative to the normal of the surface polishing plane using a field emission scanning electron microscope, dividing the measured inclinations within a range of 0–45 degrees indicated by the individual crystal grains for each pitch of 0.25 degrees, and preparing a pole plot graph by tabulating the measured inclinations present in each section for each section, and having a mean layer thickness in a range of 1–30 µm.

In the cutting tool of the present invention, the α-Al$_2$O$_3$ layer, which composes the hard coating layer, exhibits a pole plot graph in which the highest peak appears in the inclination section within a range of 0–10 degrees as shown in FIG. 2, and demonstrates superior chipping resistance. Thus, the cutting tool of the present invention exhibits superior wear resistance and cutting performance over a long period of time even during high-speed intermittent cutting of various types of steel and cast iron that is accompanied by extremely high levels of mechanical and thermal shock as well as the generation of a large amount of heat.

In the cutting tool, it is preferable for the hard coating layer to have an aluminum oxide core thin layer containing an aluminum oxide core between the lower layer and the upper layer.

In the cutting tool, it is preferable for the mean layer thickness of the aluminum oxide core thin layer to be in a range of 20–200 nm.

In the cutting tool, it is preferable that the hard coating layer is obtained by forming the Ti compound and/or Zr compound layer; forming the aluminum oxide core thin layer on the surface of the Ti compound and/or Zr compound layer under conditions of a reaction gas composition, in % by volume, of AlCl$_3$: 3–10%, CO$_2$: 0.5–3%, C$_2$H$_4$: 0.01–0.3% and H$_2$: remainder, a reaction atmosphere temperature of 750–900° C. and a reaction atmosphere pressure of 3–13 kPa; and heating the aluminum oxide core thin layer to 1100–1200° C. under conditions in which the reaction atmosphere is hydrogen and the reaction pressure is 3–13 kPa; and forming the aluminum oxide layer having an α crystal structure on the heated aluminum oxide core thin layer.

DETAILED DESCRIPTION OF THE INVENTION

As was previously explained, the cutting tool of the present invention is provided with a tool base composed with WC-based cemented carbide or TiCN-based Cermet, and a hard coating layer. The hard coating layer further comprises a Ti compound and/or Zr compound layer, which is a lower layer, and an α-Al$_2$O$_3$ layer, which is an upper layer.

The reasons for limiting the mean layer thicknesses of the upper and lower layers of the hard coating layer in the manner previously described are as indicated below.

(a) Ti Compound and/or Zr Compound Layer

The Ti compound and/or Zr compound layer is basically present as the lower layer of the α-Al$_2$O$_3$ layer. Since it has superior strength, the hard coating layer comprising it also has superior strength. In addition, since it is securely adhered to both the tool base and the α-Al$_2$O$_3$ layer, it contributes to improved adhesion of the hard coating layer to the tool base. If the mean layer thickness is less than 0.5 µm, the actions are unable to be fully demonstrated. On the other hand, if the mean layer thickness exceeds 20 µm, the thermoplastic deformation occurs easily during high-speed intermittent cutting accompanying the generation of high levels of heat, in particular, thereby causing uneven wear. Consequently, the mean layer thickness of the Ti compound and/or Zr compound layer is defined to be 0.5–20 µm.

(b) α-Al$_2$O$_3$ Layer

The α-Al$_2$O$_3$ layer improves wear resistance of the hard coating layer because Al$_2$O$_3$ itself has high hardness and superior heat resistance. At the same time, since the α-Al$_2$O$_3$ layer of the present invention has superior strength as compared with conventional α-Al$_2$O$_3$ layers, it acts to further improve the chipping resistance of the hard coating layer. However, the effects are unable to be adequately demonstrated if its mean layer thickness is less than 1 µm. On the other hand, if it is thicker than 30 µm, chipping occurs easily. Consequently, the mean layer thickness of the α-Al$_2$O$_3$ layer is defined to be 1–30 µm.

(c) Heat-Treated $Al_2O_3$ Core Thin Film

There is a close relationship between the inclination section indicating the highest peak and the ratio of the heat-treated $Al_2O_3$ core thin film, in a pole plot graph of the $\alpha$-$Al_2O_3$ layer. If the ratio of the heat-treated $Al_2O_3$ core thin film is too low, it becomes difficult to adjust the inclination section where the highest peak appears to within the range of 0–10 degrees, and it also becomes difficult to impart a satisfactory level of strength to the $\alpha$-$Al_2O_3$ layer formed by vapor deposition thereon. Consequently, the effect of improving chipping resistance is unavoidably inadequate. Thus, it is preferable to provide an $Al_2O_3$ core thin film, and particularly a heat-treated $Al_2O_3$ core thin film. Its mean layer thickness is preferably 20 nm or more, and more preferably 30 nm or more. On the other hand, since it becomes difficult to make the inclination section where the highest peak appears to be within the range of 0–10 degrees if its ratio becomes excessively large. Therefore, its mean layer thickness is preferably 200 nm or less, and more preferably 150 nm or less.

Thus, the mean layer thickness of the $Al_2O_3$ core thin film formed on the Ti compound and/or Zr compound layer prior to formation by vapor deposition of the $\alpha$-$Al_2O_3$ layer is preferably 20–200 nm, and more preferably 30–150 nm.

A TiN layer having a gold color tone may also be formed by vapor deposition as necessary as the uppermost surface layer of the hard coating layer for the purpose of discriminating before and after use of the coated Cermet cutting tool. In this case, the mean layer thickness of the TiN layer having a gold color tone is preferably 0.1–1 μm. If the mean layer thickness is less than 0.1 μm, adequate discrimination effects are unable to be obtained. In addition, a mean layer thickness of up to 1 μm is adequate for the TiN layer to demonstrate a discrimination effect.

EXAMPLES

The following provides a more detailed explanation of the cutting tool of the present invention by referring to Examples and Comparative Examples.

As raw material powders, WC powder, TiC powder, ZrC powder, VC powder, TaC powder, NbC powder, $Cr_3C_2$ powder, TiN powder, TaN powder and Co powder having a mean particle diameter of 1–3 μm were prepared. These raw material powders were blended to the blending compositions shown in Table 1, wax was added to them, and they were then mixed using a ball mill for 24 hours in acetone. After drying under reduced pressure, the dried mixtures were pressed formed into green compacts of a predetermined shape at a pressure of 98 MPa. Next, the green compacts were vacuum sintered for 1 hour in a vacuum at 5 Pa at a predetermined temperature within the range of 1370–1470° C. After sintering, the cutting edges were subjected to honing of R=0.07 mm to produce tool bases A through F made of WC-based cemented carbide having the indexable insert shape defined in ISO-CNMG 120408.

TABLE 1

| Type | | Blending Composition (% by mass) | | | | | | | | | |
|---|---|---|---|---|---|---|---|---|---|---|---|
| | | Co | TiC | ZrC | VC | TaC | NbC | $Cr_3C_2$ | TiN | TaN | WC |
| Tool | A | 7 | — | — | — | — | — | — | — | — | Rem. |
| Base | B | 5.7 | — | — | — | 1.5 | 0.5 | — | — | — | Rem. |
| | C | 5.7 | — | — | — | — | — | 1 | — | — | Rem. |
| | D | 8.5 | — | 0.5 | — | — | — | 0.5 | — | — | Rem. |
| | E | 12.5 | 2 | — | — | — | — | — | 1 | 2 | Rem. |
| | F | 14 | — | — | 0.2 | — | — | 0.8 | — | — | Rem. |

In addition, as raw material powders, TiCN (mass ratio of TiC/TiN=50/50) powder, $Mo_2C$ powder, ZrC powder, NbC powder, TaC powder, WC powder, Co powder and Ni powder having a mean particle diameter of 0.5–2 μm were prepared. These powders were mixed to the blending compositions shown in Table 2, they were then wet-mixed for 24 hours with a ball mill. After drying, they were press formed into green compacts at a pressure of 98 MPa. Next, the green compacts were sintered for 1 hour at a nitrogen atmosphere at 1.3 kPa, at a temperature of 1540° C. After sintering, the cutting edges were subjected to honing of R=0.07 mm to produce tool bases a through f made of TiCN-based Cermet having the insert shape of ISO standard CNMG 120412.

TABLE 2

| Type | | Blending Composition (% by mass) | | | | | | | |
|---|---|---|---|---|---|---|---|---|---|
| | | Co | Ni | ZrC | TaC | NbC | $Mo_2C$ | WC | TiCN |
| Tool | a | 13 | 5 | — | 10 | — | 10 | 16 | Rem. |
| Base | b | 8 | 7 | — | 5 | — | 7.5 | — | Rem. |
| | c | 5 | — | — | — | — | 6 | 10 | Rem. |
| | d | 10 | 5 | — | 11 | 2 | — | — | Rem. |
| | e | 9 | 4 | 1 | 8 | — | 10 | 10 | Rem. |
| | f | 12 | 5.5 | — | 10 | — | 9.5 | 14.5 | Rem. |

The Ti compound and/or Zr compound layers having the target layer thicknesses shown in Table 4 were first formed by vapor deposition as the lower layer of the hard coating layer under the conditions shown in Table 3 (the 1-TiCN in Table 3 indicates the formation conditions of a TiCN layer having a longitudinally growing crystal structure described in Japanese Unexamined Patent Application, First Publication No. Hei 6-8010, while others indicate the formation conditions of an ordinary particulate crystal structure) using an ordinary chemical vapor deposition device on the surfaces of these tool bases A through F and a through f.

TABLE 3

| Layers of Hard Coating Layer (numbers indicate atomic ratios) | Formation Conditions | | |
|---|---|---|---|
| | Reaction Gas Composition (% by volume) | Reaction Atmosphere | |
| | | Pressure (kPa) | Temperature (° C.) |
| TiC | $TiCl_4$: 4.2%, $CH_4$: 8.5%, $H_2$: rem. | 7 | 1020 |
| TiN (first layer) | $TiCl_4$: 4.2%, $N_2$: 30%, $H_2$: rem. | 30 | 900 |
| TiN (other layer) | $TiCl_4$: 4.2%, $N_2$: 35%, $H_2$: rem. | 50 | 1040 |
| l-$TiC_{0.5}N_{0.5}$ | $TiCl_4$: 4.2%, $N_2$: 20%, $CH_3CN$: 0.6%, $H_2$: rem. | 7 | 1000 |
| $TiC_{0.5}N_{0.5}$ | $TiCl_4$: 4.2%, $N_2$: 20%, $CH_4$: 4%, $H_2$: rem. | 12 | 1020 |
| $TiC_{0.5}O_{0.5}$ | $TiCl_4$: 4.2%, CO: 4%, $H_2$: rem. | 7 | 1020 |
| $TiC_{0.3}N_{0.3}O_{0.4}$ | $TiCl_4$: 4.2%, CO: 3%, $CH_4$: 3%, $N_2$: 20%, $H_2$: rem. | 20 | 1020 |
| ZrC | $ZrCl_4$: 4.2%, $CH_4$: 8.5%, $H_2$: rem. | 7 | 1040 |
| ZrN | $ZrCl_4$: 4.2%, $N_2$: 30%, $H_2$: rem. | 30 | 960 |
| $ZrC_{0.5}N_{0.5}$ | $ZrCl_4$: 4.2%, $N_2$: 20%, $CH_3CN$: 0.8%, $H_2$: rem. | 7 | 960 |
| $ZrC_{0.5}O_{0.5}$ | $ZrCl_4$: 4.2%, CO: 4%, $H_2$: rem. | 7 | 1040 |
| $ZrC_{0.3}N_{0.3}O_{0.4}$ | $ZrCl_4$: 4.2%, CO: 3%, $CH_4$: 3%, $N_2$: 20%, $H_2$: rem. | 20 | 1040 |
| $\alpha$-$Al_2O_3$ | $AlCl_3$: 2.2%, $CO_2$: 5.5%, HCl: 2.2%, $H_2S$: 0.2%, $H_2$: rem. | 7 | 1000 |

TABLE 4-1

| Tool | | | Hard Coating Layer (parentheses: target layer thickness: μm unless indicated in nm) | | | | | | |
|---|---|---|---|---|---|---|---|---|---|
| Type | | base symbol | 1st layer | 2nd layer | 3rd layer | 4th layer | 5th layer | 6th layer | 7th layer |
| Coated Cermet Cutting Tool of Examples | 1 | A | TiN (1) | 1-TiCN (17.5) | TiN (1) | TiCNO (0.5) | $Al_2O_3$ core thin film (50 nm) | $\alpha$-$Al_2O_3$ (3) | — |
| | 2 | B | TiN (1) | 1-TiCN (4) | TiC (4) | TiCNO (1) | $Al_2O_3$ core thin film (80 nm) | $\alpha$-$Al_2O_3$ (8) | TiN (0.3) |
| | 3 | C | TiN (1) | 1-TiCN (4.5) | TiCNO (0.5) | $Al_2O_3$ core thin film (50 nm) | $\alpha$-$Al_2O_3$ (15) | — | — |
| | 4 | D | TiN (0.5) | 1-TiCN (10) | TiC (2) | TiCNO (0.3) | $Al_2O_3$ core thin film (100 nm) | $\alpha$-$Al_2O_3$ (3) | — |
| | 5 | D | TiC (1) | 1-TiCN (4) | TiCNO (1) | $Al_2O_3$ core thin film (20 nm) | $\alpha$-$Al_2O_3$ (15) | — | — |
| | 6 | E | TiC (0.5) | 1-TiCN 9 | TiCO (0.5) | $Al_2O_3$ core thin film (50 nm) | $\alpha$-$Al_2O_3$ (8) | — | — |
| | 7 | F | TiN (1) | TiC (1) | 1-TiCN (8) | $Al_2O_3$ core thin film (150 nm) | $\alpha$-$Al_2O_3$ (5) | TiN (0.1) | — |
| | 8 | a | TiCN (1) | 1-TiCN (8.5) | TiCO (0.5) | $Al_2O_3$ core thin film (200 nm) | $\alpha$-$Al_2O_3$ (10) | — | — |
| | 9 | b | TiC (1) | 1-TiCN (9) | $Al_2O_3$ core thin film (100 nm) | $\alpha$-$Al_2O_3$ (5) | TiN (1) | — | — |
| | 10 | c | TiN (0.5) | 1-TiCN (1.5) | TiC (0.5) | TiCNO (0.5) | $Al_2O_3$ core thin film (80 nm) | $\alpha$-$Al_2O_3$ (20) | — |
| | 11 | d | TiN (1) | TiCN (19) | $Al_2O_3$ core thin film (100 nm) | $\alpha$-$Al_2O_3$ (1) | — | — | — |
| | 12 | e | TiN (1) | TiC (1) | TiCN (7) | TiCO (1) | $Al_2O_3$ core thin film (30 nm) | $\alpha$-$Al_2O_3$ (10) | TiN (0.1) |
| | 13 | f | TiCN (0.5) | TiC (2) | TiCNO (0.5) | $Al_2O_3$ core thin film (80 nm) | $\alpha$-$Al_2O_3$ (30) | TiN (0.3) | — |

TABLE 4-2

| Tool | | | Hard Coating Layer (parentheses: target layer thickness: μm unless indicated in nm) | | | | | | |
|---|---|---|---|---|---|---|---|---|---|
| Type | | base symbol | 1st layer | 2nd layer | 3rd layer | 4th layer | 5th layer | 6th layer | 7th layer |
| Coated Cermet Cutting Tool of Examples | 14 | A | ZrN (1) | ZrCN (7.5) | ZrN (1) | ZrCO (0.5) | $Al_2O_3$ core thin film (50 nm) | $\alpha$-$Al_2O_3$ (6) | — |
| | 15 | B | ZrN (1) | ZrCN (4) | ZrC (4) | ZrCNO (1) | $Al_2O_3$ core thin film (80 nm) | $\alpha$-$Al_2O_3$ (8) | TiN (0.3) |
| | 16 | C | ZrN (1) | ZrCN (16.5) | ZrCNO (0.5) | $Al_2O_3$ core thin film (200 nm) | $\alpha$-$Al_2O_3$ (3) | — | — |
| | 17 | D | TiN (0.5) | 1-TiCN (6) | ZrC (2) | ZrCNO (0.3) | $Al_2O_3$ core thin film (100 nm) | $\alpha$-$Al_2O_3$ (12) | — |
| | 18 | d | ZrC (0.5) | ZrCN (2) | TiCNO (0.5) | $Al_2O_3$ core thin film (20 nm) | $\alpha$-$Al_2O_3$ (20) | — | — |
| | 19 | e | ZrC (0.5) | ZrCN (9) | ZrCO (0.5) | $Al_2O_3$ core thin film (50 nm) | $\alpha$-$Al_2O_3$ (10) | — | — |

TABLE 4-2-continued

| Type | Tool base symbol | Hard Coating Layer (parentheses: target layer thickness: μm unless indicated in nm) | | | | | | |
|---|---|---|---|---|---|---|---|---|
| | | 1st layer | 2nd layer | 3rd layer | 4th layer | 5th layer | 6th layer | 7th layer |
| 20 | f | ZrN (1) | ZrCO (1) | ZrCN (8) | $Al_2O_3$ core thin film (150 nm) | $\alpha\text{-}Al_2O_3$ (15) | TiN (0.1) | — |

Next, $Al_2O_3$ core thin films of the target layer thicknesses shown in Table 4 were formed under low-temperature conditions in which a reaction gas composition comprising, in % by volume, $AlCl_3$: 6.5%, $CO_2$: 1.6%, $C_2H_4$: 0.13%, and $H_2$: reminder; a reaction atmosphere temperature: 820° C.; a reaction atmosphere pressure: 8 kPa; and a reaction time: 5–80 minutes (the relationship between the layer thickness of the $Al_2O_3$ core thin film and a reaction time was assessed in advance by an experiment, similar to the case of the Ti compound layer). Next, the $Al_2O_3$ core thin film was heat treated under conditions of changing the reaction atmosphere pressure to a hydrogen atmosphere at 8 kPa and raising the reaction atmosphere temperature to 1135° C. Subsequently, cutting tools of Examples 1, 3–6 and 8–11, 14, 16–19 were produced by forming by vapor deposition the $\alpha\text{-}Al_2O_3$ layers of the target layer thicknesses shown in Table 4 for the upper layer of the hard coating layer under the conditions shown in the Table 3.

Moreover, cutting tools of Examples 2, 7, 12, 13, 15 and 20 were produced by forming by vapor deposition the TiN layers of the target layer thicknesses shown in Table 4 for the uppermost surface layer of the hard coating layer under the conditions shown in the Table 3 on the resulting $\alpha\text{-}Al_2O_3$ layers.

In addition, for the sake of comparison, comparative cutting tools 1 through 20 were respectively produced under the same conditions with the exception of not forming the $Al_2O_3$ core thin film and not performing heat treatment prior to forming the $\alpha\text{-}Al_2O_3$ layer of the hard coating layer as shown in Table 5.

TABLE 5

| Tool | | Hard Coating Layer (parentheses: target layer thickness: μm) | | | | | |
|---|---|---|---|---|---|---|---|
| | Base Symbol | 1st layer | 2nd layer | 3rd layer | 4th layer | 5th layer | 6th layer |
| Coated Cermet Cutting Tools of Comparative Examples | 1 A | TiN (1) | 1-TiCN (17.5) | TiN (1) | TiCNO (0.5) | $\alpha\text{-}Al_2O_3$ (3) | — |
| | 2 B | TiN (1) | 1-TiCN (4) | TiC (4) | TiCNO (1) | $\alpha\text{-}Al_2O_3$ (8) | TiN (0.3) |
| | 3 C | TiN (1) | 1-TiCN (4.5) | TiCNO (0.5) | $\alpha\text{-}Al_2O_3$ (15) | — | — |
| | 4 D | TiN (0.5) | 1-TiCN (10) | TiC (2) | TiCNO (0.3) | $\alpha\text{-}Al_2O_3$ (3) | — |
| | 5 D | TiC (1) | 1-TiCN (4) | TiCNO (1) | $\alpha\text{-}Al_2O_3$ (15) | — | — |
| | 6 E | TiC (0.5) | 1-TiCN (9) | TiCO (0.5) | $\alpha\text{-}Al_2O_3$ (8) | — | — |
| | 7 F | TiN (1) | TiC (1) | 1-TiCN (8) | $\alpha\text{-}Al_2O_3$ (5) | TiN (0.1) | — |
| | 8 a | TiCN (1) | 1-TiCN (8.5) | TiCO (0.5) | $\alpha\text{-}Al_2O_3$ (10) | — | — |
| | 9 b | TiC (1) | 1-TiCN (9) | $\alpha\text{-}Al_2O_3$ (5) | TiN (1) | — | — |
| | 10 c | TiN (0.5) | 1-TiCN (1.5) | TiC (0.5) | TiCNO (0.5) | $\alpha\text{-}Al_2O_3$ (20) | — |
| | 11 d | TiN (1) | TiCN (19) | $\alpha\text{-}Al_2O_3$ (1) | — | — | — |
| | 12 e | TiN (1) | TiC (1) | TiCN (7) | TiCO (1) | $\alpha\text{-}Al_2O_3$ (10) | TiN (0.1) |
| | 13 f | TiCN (0.5) | TiC (2) | TiCNO (0.5) | $\alpha\text{-}Al_2O_3$ (30) | TiN (0.3) | — |
| | 14 A | ZrN (1) | ZrCN (7.5) | ZrN (1) | ZrCO (0.5) | $\alpha\text{-}Al_2O_3$ (6) | — |
| | 15 B | ZrN (1) | ZrCN (4) | ZrC (4) | ZrCNO (1) | $\alpha\text{-}Al_2O_3$ (8) | TiN (0.3) |
| | 16 C | ZrN (1) | ZrCN (16.5) | ZrCNO (0.5) | $\alpha\text{-}Al_2O_3$ (3) | — | — |
| | 17 D | TiN (0.5) | 1-TiCN (6) | ZrC (2) | ZrCNO (0.3) | $\alpha\text{-}Al_2O_3$ (12) | — |
| | 18 d | ZrC (0.5) | ZrCN (2) | TiCNO (0.5) | $\alpha\text{-}Al_2O_3$ (20) | — | — |
| | 19 e | ZrC (0.5) | ZrCN (9) | ZrCO (0.5) | $\alpha\text{-}Al_2O_3$ (10) | — | — |
| | 20 f | ZrN (1) | ZrCO (1) | ZrCN (8) | $\alpha\text{-}Al_2O_3$ (15) | TiN (0.1) | — |

Production of Pole Plot Graphs

Pole plot graphs were respectively produced using a field emission scanning electron microscope for the $\alpha$-$Al_2O_3$ layers that compose the hard coating layer with the resulting coated Cermet cutting tools of Examples 1–20 and coated Cermet cutting tools of Comparative Examples 1–20.

Namely, the surface of the $\alpha$-$Al_2O_3$ layer was placed inside the barrel of a field emission scanning electron microscope as the polishing plane. Next, an electron beam having an acceleration voltage of 15 kV was emitted onto individual crystal grains having a hexagonal crystal lattice present within the measuring range of the surface polishing plane at an emission current of 1 nA and incident angle of 70 degrees relative to the polishing plane. Inclination of the (0001) plane, which is the crystal plane of the crystal grains, was measured relative to the normal of the surface polishing plane in intervals of 0.1 μm/step for a region measuring 30×50 μm using an electron backscattering diffraction imaging device. The measured inclination within the range of 0–45 degrees indicated by each crystal grain was divided for each pitch of 0.25 degrees based on the measurement results, and the measured inclinations present in each section were tabulated for each section to prepare pole plot graphs.

The inclination sections in which the (0001) plane exhibits the highest peak are respectively shown in Tables 6-1 and 6-2 in the resulting pole plot graphs of the $\alpha$-$Al_2O_3$ layer.

TABLE 6-1

|  |  | Inclination section in which (0001) plane of $\alpha$-$Al_2O_3$ layer indicates highest peak (degrees) | Amount of flank wear (mm) | | |
|---|---|---|---|---|---|
|  |  |  | Alloy steel | Carbon steel | Cast iron |
| Coated | 1 | 3.25–3.50 | 0.31 | 0.30 | 0.33 |
| Cermet | 2 | 1.00–1.25 | 0.23 | 0.24 | 0.25 |
| Cutting | 3 | 1.50–1.75 | 0.26 | 0.25 | 0.24 |
| Tool of | 4 | 2.75–3.00 | 0.32 | 0.31 | 0.34 |
| Examples | 5 | 8.00–8.25 | 0.38 | 0.36 | 0.35 |
|  | 6 | 2.00–2.25 | 0.28 | 0.28 | 0.29 |
|  | 7 | 5.25–5.50 | 0.33 | 0.34 | 0.37 |
|  | 8 | 9.75–10.00 | 0.37 | 0.36 | 0.36 |
|  | 9 | 2.25–2.50 | 0.29 | 0.29 | 0.31 |
|  | 10 | 0.50–0.75 | 0.23 | 0.21 | 0.21 |
|  | 11 | 3.50–3.75 | 0.38 | 0.39 | 0.45 |
|  | 12 | 4.25–4.50 | 0.34 | 0.33 | 0.33 |
|  | 13 | 0.00–0.25 | 0.25 | 0.20 | 0.19 |
|  | 14 | 3.00–3.25 | 0.30 | 0.32 | 0.31 |
|  | 15 | 1.50–1.75 | 0.24 | 0.25 | 0.26 |
|  | 16 | 1.00–1.25 | 0.26 | 0.24 | 0.26 |
|  | 17 | 2.75–3.00 | 0.32 | 0.30 | 0.33 |
|  | 18 | 8.50–8.75 | 0.39 | 0.38 | 0.36 |
|  | 19 | 1.50–1.75 | 0.25 | 0.26 | 0.27 |
|  | 20 | 5.00–5.25 | 0.34 | 0.32 | 0.35 |

TABLE 6-2

|  |  | Inclination section in which (0001) plane of $\alpha$-$Al_2O_3$ layer indicates highest peak (degrees) | Cutting test results (time to reach service life) | | |
|---|---|---|---|---|---|
|  |  |  | Alloy steel | Carbon steel | Cast iron |
| Coated | 1 | 25.75–26.00 | 2.8 min. | 2.7 min. | 2.9 min. |
| Cermet | 2 | 29.50–29.75 | 1.7 min. | 1.5 min. | 1.0 min. |
| Cutting | 3 | 33.50–33.75 | 0.5 min. | 0.3 min. | 0.3 min. |
| Tool of | 4 | 26.50–26.75 | 2.7 min. | 2.9 min. | 3.0 min. |
| Comparative | 5 | 32.25–32.50 | 0.5 min. | 0.4 min. | 0.5 min. |
| Examples | 6 | 29.50–29.75 | 1.5 min. | 1.8 min. | 1.9 min. |
|  | 7 | 27.50–27.75 | 2.0 min. | 2.1 min. | 1.6 min. |
|  | 8 | 31.00–31.25 | 0.9 min. | 0.7 min. | 0.6 min. |
|  | 9 | 26.25–26.50 | 2.2 min. | 1.9 min. | 1.9 min. |

TABLE 6-2-continued

|  | Inclination section in which (0001) plane of $\alpha$-$Al_2O_3$ layer indicates highest peak (degrees) | Cutting test results (time to reach service life) | | |
|---|---|---|---|---|
|  |  | Alloy steel | Carbon steel | Cast iron |
| 10 | 33.25–33.50 | 0.3 min. | 0.3 min. | 0.5 min. |
| 11 | 25.00–25.25 | 3.1 min. | 2.6 min. | 1.5 min. |
| 12 | 31.50–31.75 | 1.1 min. | 0.8 min. | 0.8 min. |
| 13 | 34.75–35.00 | 0.2 min. | 0.3 min. | 0.5 min. |
| 14 | 25.75–26.00 | 2.9 min. | 2.8 min. | 2.7 min. |
| 15 | 29.00–29.25 | 1.8 min. | 1.7 min. | 1.2 min. |
| 16 | 32.50–32.75 | 0.8 min. | 0.5 min. | 0.9 min. |
| 17 | 28.50–28.75 | 2.5 min. | 2.8 min. | 3.0 min. |
| 18 | 34.25–34.50 | 0.5 min. | 0.3 min. | 0.7 min. |
| 19 | 29.25–29.50 | 1.7 min. | 1.8 min. | 2.0 min. |
| 20 | 27.75–28.00 | 2.2 min. | 1.9 min. | 1.8 min. |

(In the table, service life was reached due to the occurrence of chipping in the hard coating layer.)

Thickness of Each Layer of Hard Coating Layer

The thickness of each layer of the hard coating layers of the resulting coated Cermet cutting tools of Examples 1–20 and Comparative Examples 1–20 was measured using a scanning electron microscope (measurement of longitudinal cross-section). As a result, all of the mean layer thicknesses (average of five measuring points) were confirmed to be substantially the same as the target layer thickness. Furthermore, measurement of the layer thickness of the heat-treated $Al_2O_3$ core thin film in the coated Cermet cutting tools of Examples 1–20 was extremely difficult.

Next, coated Cermet cutting tools of Examples 1–7 and 14–17 and coated Cermet coating tools of Comparative Examples 1–7 and 14–17 were bolted onto the end of a tool steel cutting bit followed by performing the cutting tests described below.

Dry High-Speed Intermittent Cutting Test Using Alloy Steel

The amount of flank wear of the cutting edge, or when that was unable to be measured, the service life of the cutting edge, namely the amount of time until chipping occurred in the hard coating layer, was measured. The cut material and test conditions used are indicated below. The test results are shown in Table 6.

Cut material: Round bar composed of JIS-SCM440 in which four longitudinal grooves are formed at equal intervals in the direction of length Cutting speed: 350 m/min (normal cutting speed: 250 m/min)

Cutting depth: 1 mm

Feed: 0.25 mm/rev.

Cutting time: 5 min.

Dry High-Speed Intermittent Cutting Test Using Carbon Steel

Similar to the Dry High-Speed Intermittent Cutting Test Using Alloy Steel, the amount of wear of the flank of the cutting edge or the service life of the cutting edge was measured. The cut material and test conditions used are indicated below. The results are shown in Table 6.

Cut material: Round bar composed of JIS-S45C in which four longitudinal grooves are formed at equal intervals in the direction of length Cutting speed: 400 m/min (normal cutting speed: 300 m/min)

Cutting depth: 1 mm

Feed: 0.25 mm/rev.

Cutting time: 5 min.

Dry High-Speed Intermittent Cutting Test Using Cast Iron

Similar to these tests, the amount of wear of the flank of the cutting edge or the service life of the cutting edge was measured. The cut material and test conditions used are indicated below. The results are shown in Table 6.

Cut material: Round bar composed of JIS-FC300 in which four longitudinal grooves are formed at equal intervals in the direction of length Cutting speed: 450 m/min (normal cutting speed: 300 m/min)

Cutting depth: 1.5 mm

Feed: 0.25 mm/rev.

Cutting time: 5 min.

Moreover, the coated Cermet cutting tools of Examples 8–13 and 18–20 and the coated Cermet cutting tools of Comparative Examples 8–13 and 18–20 were bolted to the end of the tool steel cutting bit followed by performing the cutting tests described below.

Dry High-Speed Intermittent Cutting Test Using Alloy Steel

Similar to these tests, the amount of wear of the flank of the cutting edge or the service life of the cutting edge was measured. The cut material and test conditions used are indicated below. The results are shown in Table 6.

Cut material: Round bar composed of JIS-SCM440 in which four longitudinal grooves are formed at equal intervals in the direction of length Cutting speed: 400 m/min (normal cutting speed: 250 m/min)

Cutting depth: 0.7 mm

Feed: 0.15 mm/rev.

Cutting time: 5 min.

Dry High-Speed Intermittent Cutting Test Using Carbon Steel

Similar to these tests, the amount of wear of the flank of the cutting edge or the service life of the cutting edge was measured. The cut material and test conditions used are indicated below. The results are shown in Table 6.

Cut material: Round bar composed of JIS-S45C in which four longitudinal grooves are formed at equal intervals in the direction of length Cutting speed: 400 m/min (normal cutting speed: 300 m/min)

Cutting depth: 0.7 mm

Feed: 0.15 mm/rev.

Cutting time: 5 min.

Dry High-Speed Intermittent Cutting Test Using Cast Iron

Similar to these tests, the amount of wear of the flank of the cutting edge or the service life of the cutting edge was measured. The cut material and test conditions used are indicated below. The results are shown in Table 6.

Cut material: Round bar composed of JIS-FC300 in which four longitudinal grooves are formed at equal intervals in the direction of length Cutting speed: 450 m/min (normal cutting speed: 300 m/min)

Cutting depth: 0.7 mm

Feed: 0.15 mm/rev.

Cutting time: 5 min.

As shown in Tables 4 through 6, in the coated Cermet cutting tools of the Examples 1–20, the (0001) plane of the $\alpha$-$Al_2O_3$ layer indicated the highest peak in the inclination section within the range of 0–10 degrees in the pole plot graphs. Consequently, these cutting tools demonstrated extremely high resistance to mechanical and thermal shock, and superior chipping resistance even during high-speed intermittent cutting of steel or cast iron accompanied by the generation of a large amount of heat. The cutting tools significantly suppressed the occurrence of chipping of the cutting edge, and exhibited superior wear resistance.

In contrast, in the case of the Cermet cutting tools of Comparative Examples 1 to 20, the (0001) plane of the $\alpha$-$Al_2O_3$ layer, which is the upper layer of the hard coating layer, indicated the highest peak in the inclination section within the range of 25–35 degrees in the pole plot graphs. Consequently, these cutting tools were unable to withstand the severe mechanical and thermal shock during high-speed intermittent cutting, chipping occurred in the cutting edge, and the cutting tools reached the end of their service life in a comparatively short period of time.

As has been described above, the cutting tool of the present invention is naturally capable of continuous and intermittent cutting of various types of steel and cast iron under normal conditions, is extremely resistant to mechanical and thermal shock, exhibits superior chipping resistance even during the most severe high-speed intermittent cutting accompanied the generation of a large amount of heat, and demonstrates superior cutting performance over a long period of time. Thus, the cutting tool of the present invention is capable of satisfactorily accommodating increased performance of cutting devices, labor and energy savings in cutting processing, as well as reductions in costs.

What is claimed is:

1. A cutting tool provided with a tool base composed with tungsten carbide-based cemented carbide or titanium carbonitride-based Cermet, and a hard coating layer provided on the surface of the tool base; wherein the hard coating layer comprises:

(a) at least one of a Ti compound and a Zr compound layer, which is a lower layer, comprising at least one layer of a Ti carbide layer, Ti nitride layer, Ti carbonitride layer, Ti oxicarbide layer, Ti oxicarbonitride layer, Zr carbide layer, Zr nitride layer, Zr carbonitride layer, Zr oxicarbide layer and Zr oxicarbonitride layer formed by chemical vapor deposition, and having an overall mean layer thickness of 0.5–20 µm, and (b) an aluminum oxide layer having an $\alpha$ crystal structure in the state of being formed by chemical vapor deposition, which is an upper layer, comprising the highest peak in the inclination section within a range of 0–10 degrees in the case of emitting an electron beam onto individual crystal grains having a hexagonal crystal lattice present within the measuring range of the surface polishing plane, measuring the inclination of the (0001) crystal plane of the crystal grains relative to the normal of the surface polishing plane using a field emission scanning electron microscope, dividing the measured inclinations within a range of 0–45 degrees indicated by the individual crystal grains for each pitch of 0.25 degrees, and preparing a pole plot graph by tabulating the measured inclinations present in each section for each section, and having the mean layer thickness is 1–30 µm.

2. A cutting tool according to claim 1, wherein the hard coating layer has an aluminum oxide core thin layer containing an aluminum oxide core between the lower layer and the upper layer.

3. A cutting tool according to claim 2, wherein the mean layer thickness of the aluminum oxide core thin layer is 20–200 nm.

* * * * *